(12) United States Patent
Yang

(10) Patent No.: US 7,566,526 B2
(45) Date of Patent: Jul. 28, 2009

(54) METHOD OF EXPOSURE FOR LITHOGRAPHY PROCESS AND MASK THEREFOR

(75) Inventor: Chin Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 422 days.

(21) Appl. No.: 11/017,684

(22) Filed: Dec. 22, 2004

(65) Prior Publication Data

US 2006/0134565 A1 Jun. 22, 2006

(51) Int. Cl.
*G03F 7/00* (2006.01)
(52) U.S. Cl. .................. 430/322; 430/394; 430/311; 430/5
(58) Field of Classification Search .................. 430/394, 430/5, 311, 322
See application file for complete search history.

(56) References Cited

U.S. PATENT DOCUMENTS

| | | | | |
|---|---|---|---|---|
| 4,394,437 A | * | 7/1983 | Bergendahl et al. | 430/312 |
| 5,413,898 A | * | 5/1995 | Kim et al. | 430/325 |
| 5,753,417 A | * | 5/1998 | Ulrich | 430/312 |
| 6,528,238 B1 | * | 3/2003 | Seniuk et al. | 430/312 |
| 6,881,524 B2 | * | 4/2005 | Cauchi et al. | 430/5 |
| 7,026,106 B2 | * | 4/2006 | Chang | 430/394 |
| 2002/0051943 A1 | * | 5/2002 | Tanaka et al. | 430/311 |
| 2003/0113674 A1 | * | 6/2003 | Cauchi | 430/394 |

* cited by examiner

*Primary Examiner*—Mark F Huff
*Assistant Examiner*—Caleen O Sullivan
(74) *Attorney, Agent, or Firm*—Jianq Chyun IP Office

(57) ABSTRACT

An improved photolithography method and mask are disclosed. The method exposes a substrate coated with a photosensitive material using a first mask. The photosensitive material after said first exposure includes one or more under-exposed or incompletely exposed portions or one or more portions prone to peeling. The under-exposed or incompletely exposed portions or portions prone to peeling are subjected to a second exposure using a second mask. The second mask includes a pattern for projecting an image on the substrate coated with the photosensitive material. The image corresponds to areas of the photosensitive material that have been under-exposed or incompletely exposed or areas prone to peeling.

22 Claims, 4 Drawing Sheets

METHOD OF EXPOSURE FOR LITHOGRAPHY PROCESS AND MASK THEREFOR

FIELD OF THE INVENTION

This invention relates generally to semiconductor devices and fabrication processes and, more particularly, to an improved exposure method and mask for photolithography.

BACKGROUND OF THE INVENTION

A common process implemented during fabrication of semiconductor devices is photolithography or lithography. For this process, light may be radiated through a patterned mask onto a substrate covered with a light-sensitive or photosensitive material, e.g., photoresist. The radiated light can be in the ultra-violet (UV) wavelength range for exposing the photosensitive material. Radiating light to expose portions of the photosensitive material changes the chemical composition of those portions. Such a chemical composition change can allow the exposed portions to be removed faster than the unexposed portions, e.g., when using positive photoresist. Alternatively, the chemical composition change can make the exposed potions more difficult to dissolve, e.g., when using negative photoresist. In either case, the photosensitive material that remains after development is typically used as a protective mask in subsequent fabrication steps.

As semiconductor devices become more advanced and sophisticated, the patterned structures etched on a substrate are becoming smaller and more dense. One problem arises from the difference in optical behavior at dense patterns and small iso spaces. This phenomena may also be known as the "proximity effect" or "optical proximity effect." This effect occurs when radiated light through a patterned mask for exposing photosensitive material is scattered, which can cause undesirable exposure results. For example, in creating dense patterns of a particular target dimension and optimal exposure energy, this effect can cause incomplete exposure or under-exposure of the photosensitive material in the small iso spaces between unexposed potions. As a result, the incomplete or under exposed portions of photosensitive material in the small spaces after development may turn into "scum."

Scum may be avoided by redesigning the mask used to create the pattern by using optical proximity correction ("OPC") operations well-known in the prior art. However, OPC is an expensive and time consuming undertaking. Additionally, it requires the creation new masks, which can be expensive. Scum may also be avoided by adjusting the numerical aperture (NA) and/or coherence of the illuminator (Sigma) for the light radiation source in an effort to expose the small iso spaces between the intended unexposed portions of the photosensitive material. However, adjustment of NA and Sigma may result in the creation of lithography patterns with dimensions smaller than designed and because of differing distortion, which in turn can lead to conducting layer dimensions that are smaller than intended. Such smaller dimensions can lead to higher resistances, thereby slowing signal speeds. Alternatively, scum may be removed by manual repair methods known in the art, such as laser repair. However, the afflicted portions may be too large and the defects too pervasive for such repairs to be cost-effective and efficient.

Another problem with forming dense or narrow line patterns arises from the fact that their dimensions are smaller than the default minimum design rule for next generation product test patterns. Such dense and narrow line patters are more prone to peeling of the photosensitive material due to the small surface area available for the material to adhere to the substrate. For example, such situations may arise in "drop-in"areas- non-essential areas of a semiconductor device sometimes used for experimenting and testing semiconductor structures. These test structures may-have smaller lines and space patterns than the structures found in the essential areas, while the thickness of the photosensitive layer remains the same. This situation makes the photosensitive material in the dense and narrow line areas especially susceptible to peeling. Peeling of photosensitive material creates debris that may cause serious damage to a semiconductor device in subsequent fabrication steps.

Thus, what is needed are improved photolithography or lithography processes that avoid forming scum and peeling of photosensitive material.

BRIEF SUMMARY OF THE INVENTION

According to one aspect of the invention, a semiconductor photolithography method is disclosed that provides a substrate coated with a photosenstive material having one or more under-exposed or incompletely exposed portions. The one or more under-exposed or incompletely exposed portions are further exposed such that those portions are completely exposed.

According to another aspect of the invention, a semiconductor photolithography method is disclosed that exposes photosensitive material on a substrate with a first dose of light radiation using a first mask. The photosensitive material exposed with the first mask includes one or more under-exposed or incompletely exposed portions. The under-exposed or incompletely exposed portions are exposed with a second dose of light radiation using a second mask such that the under-exposed or incompletely exposed portions are further exposed.

According to another aspect of the invention, a semiconductor photolithography method is disclosed that exposes photosensitive material on a substrate with a first dose of light radiation using a first mask. The photosensitive material exposed with the first mask includes one or more portions prone to peeling. The photosensitive material portions prone to peeling is subjected to a second dose of light radiation through a second mask such that the portions prone to peeling are exposed.

According to another aspect of the invention, a method for fabricating a semiconductor device is disclosed that exposes a substrate coated with a photosensitive material using a first mask. The exposed photosensitive layer includes one or more under-exposed or incompletely exposed portions or one or more portions prone to peeling. The under-exposed or incompletely exposed portions or portions prone to peeling are subjected to a second exposure using a second mask.

According to another aspect of the invention, a photolithography mask is disclosed having a pattern. The pattern is for projecting an image on a substrate coated with photosensitive material. The image corresponds to areas of the photosensitive material that have been under-exposed or incompletely exposed or areas prone to peeling.

BRIEF DESCRIPTION OF THE DRAWINGS

The accompanying drawings, which are incorporated in and constitute part of this specification, illustrate examples and embodiments of the invention, and together with the description, serve to explain the principles of the invention. In the drawings.

DETAILED DESCRIPTION OF THE INVENTION

Reference will now be made in detail to the exemplary embodiments of the invention, examples of which are illustrated in the accompanying drawings. Wherever possible, the same reference numbers will be used throughout the drawings to refer to the same.

The following example methods and masks overcome one or more disadvantages of prior photolithography or lithography techniques. According to one example, a substrate coated with a photosensitive material is exposed using a first mask. The exposed photosensitive material includes one or more under-exposed or incompletely exposed portions or one or more portions prone to peeling. The under-exposed or incompletely exposed portions or portions prone to peeling are subjected to a second exposure using a second mask. This second exposure allows the portions that are under-exposed or incompletely exposed to be further exposed as desired for subsequent fabrication steps. This second exposure may also allow the portions that are under-exposed or incompletely exposed to be completely exposed if desired. The second exposure may also prevent portions prone to peeling by removing those portions of photosensitive material. The exposure may be accomplished either by direct exposure, wherein radiation is projected directly through transparent or semi-transparent areas of a pattern of a mask onto the photosensitive material, or by reflective type exposure, wherein radiation is reflected off of a reflective surface patterned on a mask, onto the photosensitive material. As used herein, the term "opening" refers to any area of a mask that allows radiation to pass, such as transparent or semi-transparent areas, or holes.

Figure 1:
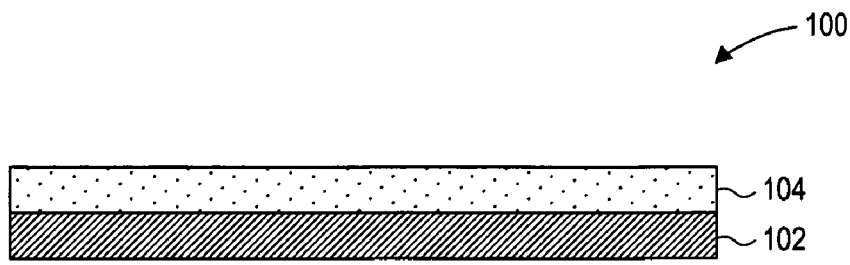
FIG. 1 illustrates one example of a cross-sectional view of a semiconductor work piece for a photolithography process.

FIGS. 1-4 illustrate exemplary cross-sectional views for a photolithography process when fabricating a semiconductor device or work piece. Referring to FIG. 1, a work piece 100 is shown for the photolithography process. Initially, a substrate 102 is coated with a photoresist 104. The photoresist 104 can be coated on substrate 102 using known coating processes. Examples of photoresist 104 include positive or negative photoresist in which exposed or unexposed portions of the photoresist can be easily removed after development. The substrate 102 and photoresist 104 can then be soft baked to remove solvents from the photoresist in which known soft baking methods can be used. The resulting device is a semiconductor work piece 100, which can include any type of semiconductor based substrate and coated with any number of layers of photosensitive material.

Figure 2:
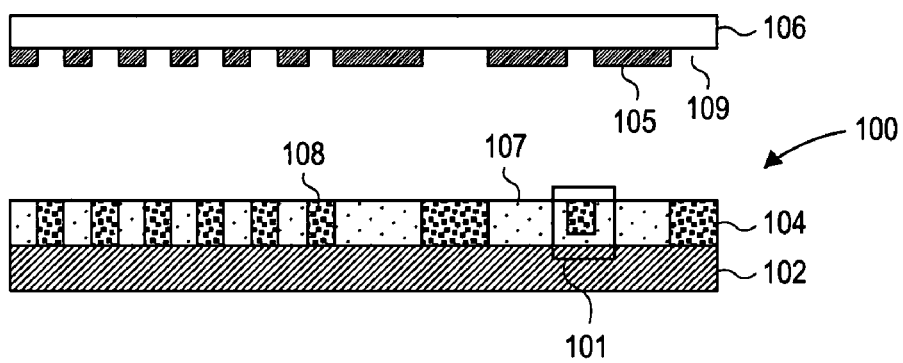
FIG. 2 illustrates one example of cross-sectional views of a mask and the semiconductor work piece for the photolithography process.

FIG. 2 illustrates one example of cross-sectional views of a mask 106 and the semiconductor work piece 100 for the photolithography process. After soft baking, the work piece 100 is exposed to light radiation through a first mask 106 having a pattern 105 formed thereon along with light passing sections or openings 109. The pattern 105 is thus projected onto the photoresist 104. Also, in this step, the light can be radiated using an energy level to achieve the desired critical dimensions, wherein known light exposure techniques can be used. The radiated light can be in the ultra-violet (UV) wavelength range. In another aspect, the wavelength of the light may be a g-line type (436 nm), l-line type (365 nm), KrF excimer laser (248 nm), ArF excimer laser (193 nm), or F2 excimer laser (153 nm). In this example, the mask 106 can be a half tone phase shift mask. Other types of masks known in the field may also be used to project pattern 105 onto the work piece 100.

In this example, the photoresist 104 includes exposed portions 108 and non-exposed portions 107. The non-exposed portions 107 correspond to the pattern 105 and the exposed portions 108 correspond to the light passing sections or openings 109 on the first mask 106. The exposed portions 108 or non-exposed portions 107 can change chemically depending on the type of photoresist used. For example, in the case of positive photoresist, the layers (e.g., metal lines) formed on the exposed portions 108 can be removed or washed away leaving behind a layer pattern that corresponds to the pattern 105 on the mask 106.

However, in certain instances, a proximity effect or optical proximity effect may cause some areas of the photoresist 104—i.e., area 101 shown in the rectangle—to be underexposed or incompletely exposed as compared with other exposed areas. This can be problematic when forming subsequent structures on the work piece 100. To cure this effect, as described below, one or more subsequent masks can be used for projecting another image directed to those under-exposed or incompletely exposed areas 101. This allows those areas to be completely exposed for forming the desired structures on the work piece 100.

Figure 3:
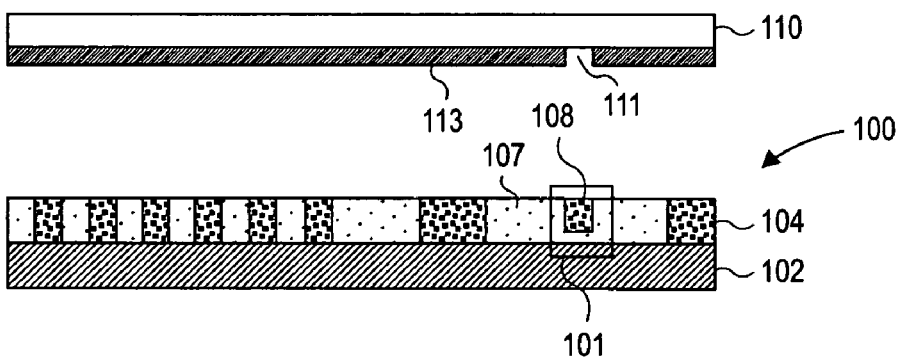
FIG. 3 illustrates one example of cross-sectional views of another mask for exposing under-exposed or incompletely exposed portions of the semiconductor work piece in FIG. 2.

FIG. 3 illustrates one example of cross-sectional views of another mask 110 for further exposing the under-exposed or incompletely exposed areas 101 of the semiconductor work piece 100 in FIG. 2. After exposure using the first mask 106, the work piece 100 is exposed with another dose of light radiation using a second mask 110. The second mask 110 includes a pattern 113 formed thereon with a light passing section 111. Examples of the second mask 110 may include a binary mask (BIM), however, other types of mask may be used. The pattern 113 allows light to be radiated on the underexposed or incompletely exposed portion, so as to further expose areas 101. As shown in FIG. 3, the exposed areas 108 may be completely exposed.

For example, in this step, the light can be radiated using an optimal energy level to achieve the desired critical dimensions for further exposure of the photoresist 104. In one example, the second dose of light radiation using the second mask 110 can be less than the first dose of light radiation using the first mask 106. By exposing the under-exposed or incompletely exposed areas 101, any unwanted photoresist may be removed, and scum can be prevented from forming. These subsequent exposure steps may be referred to as "trimming." In particular, light is radiated through the light-passing area or opening 111 to expose area 101, which previously comprised under-exposed or incompletely exposed photoresist. The mask 110 for trimming can contain simple patterns 113 for reducing costs during photolithography.

Figure 4:
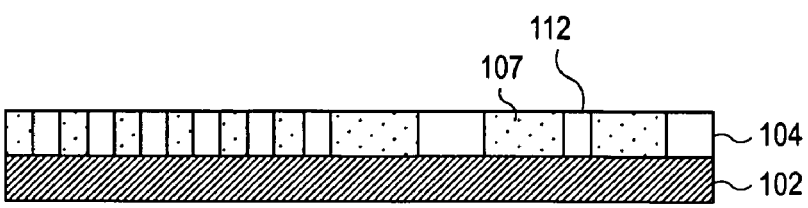
FIG. 4 illustrates one example of a cross-sectional view of the semiconductor work piece after being exposed with the mask of FIG. 3.

After trimming and post-exposure baking (PEB), the work piece 100 is developed to remove or wash away the exposed portions 108 of photoresist 104. Hard baking (HB) to harden the remaining photoresist may subsequently occur. PEB and HB may be accomplished methods known in the field. Due to the second exposure of area 101, unwanted photoresist or scum is removed and the resulting work piece 100, as illustrated in FIG. 4, contains only the desired pattern of photoresist defined by photoresist portions 107 and openings 112. The light-passing areas or openings 112 corresponding to the removed portions 108 of the photoresist 104. Although not shown, subsequent layers or metal layers may be formed in the openings 112 or on the remaining portions 107. The above exemplary processes used two exposures and masks, however, additional exposures and masks may be implemented on the work piece 100, as needed, to expose additional areas of photosensitive material, which may be under-exposed, or incompletely exposed by preceding steps.

Figure 5:
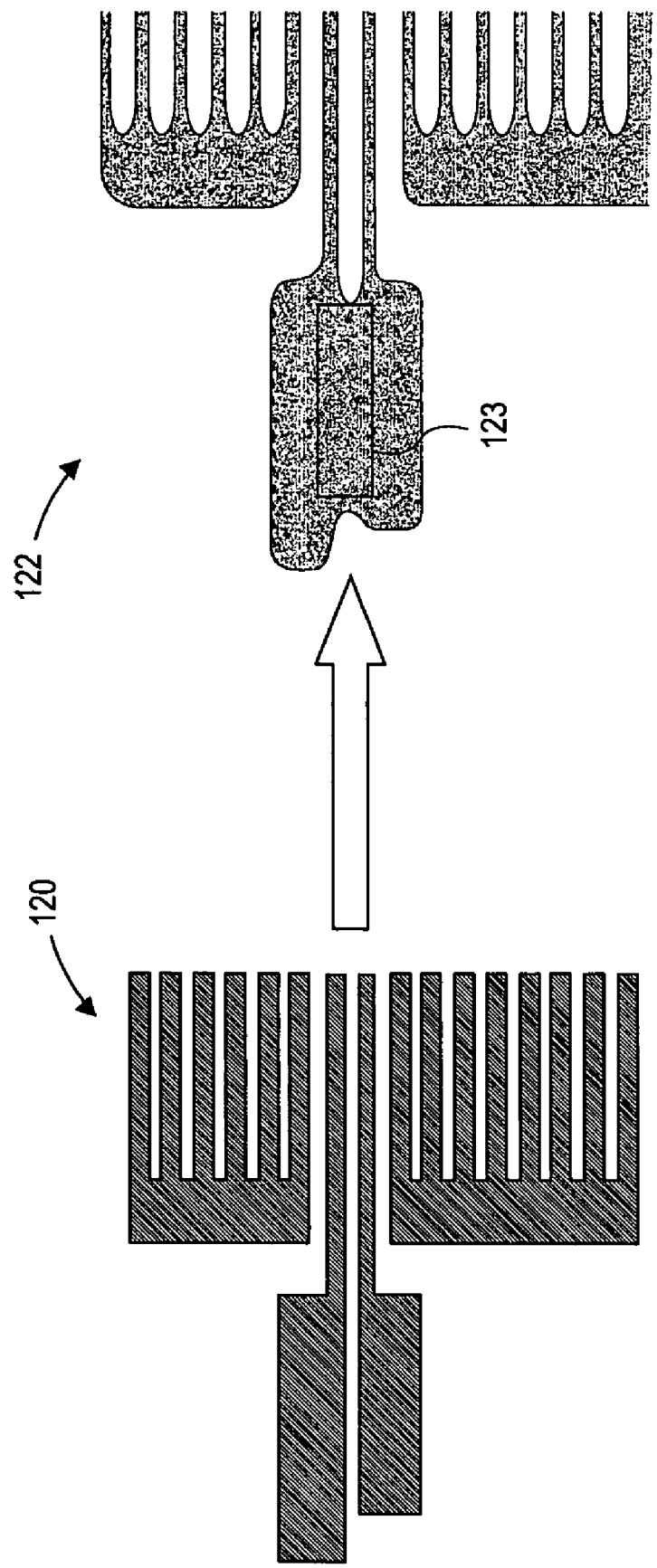
FIG. 5 illustrates one example overhead view of a mask for photolithography and a depiction of the exposure results of using the mask on a photoresist layer having portions that are under-exposed or incompletely exposed.
Figure 6:
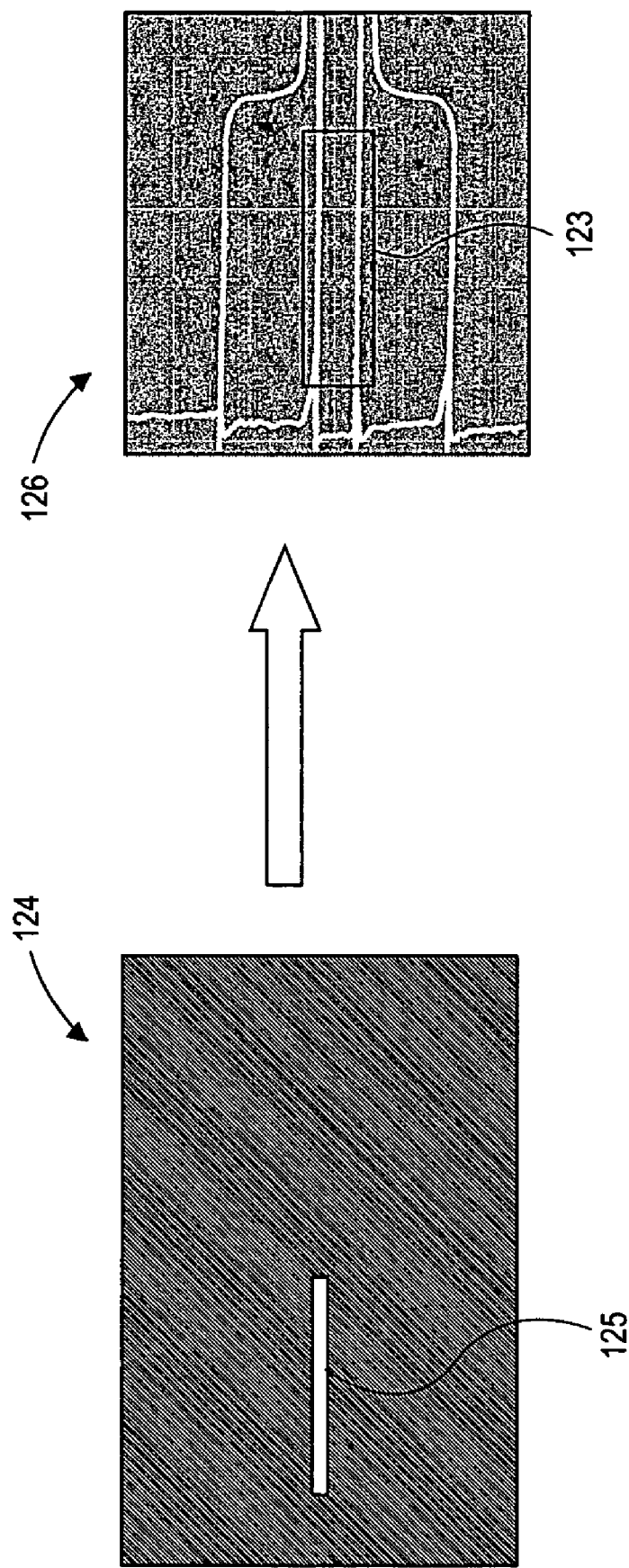
FIG. 6 illustrates one example overhead view of another mask for photolithography and a depiction of the exposure results where the under-exposed or incompletely exposed portions are removed.

FIGS. 5 and 6 illustrate other examples for reexposing under-exposed or incompletely exposed portions of photosensitive material. Referring to FIG. 5, a mask 120 is shown having substantially line-shaped patterns, which can be projected on a work piece covered with photoresist, referring to the exposure shown in image 122. The darker portions in the image 122 refer to unexposed portions in which light was not received in the photoresist. The lighter portions in the image 122 refer to exposed portions in which light was received in the photoresist. These portions have corresponding areas on the mask 120 where the darker areas block light and the lighter areas allow light to pass through.

In this example, however, area 123 in the image 122 contains under-exposed or incompletely exposed portions of photoresist. That is, area 123 should include completely exposed areas of photoresist that provides clear delineation between exposed and unexposed portions of photoresist. Nevertheless, the under-exposed or incompletely exposed portions of photoresist in area 123 can be reexposed with a subsequent mask.

Referring to FIG. 6, a mask 124 is shown having an opening or light transparent section—small line pattern 125—for allowing light to pass through onto area 123 of FIG. 5. The dark areas of mask 124 block out radiating light. In this example, the small line pattern 125 is projected to expose the under-exposed or incompletely exposed portions of photoresist in area 123. As a result, those portions of photoresist are further exposed, and in this example, completely exposed, providing a clear delineation between exposed and unexposed portions of photoresist in area 123. In this manner, unwanted photoresist is removed and scum is prevented from forming on the work piece after development.

Figure 7:
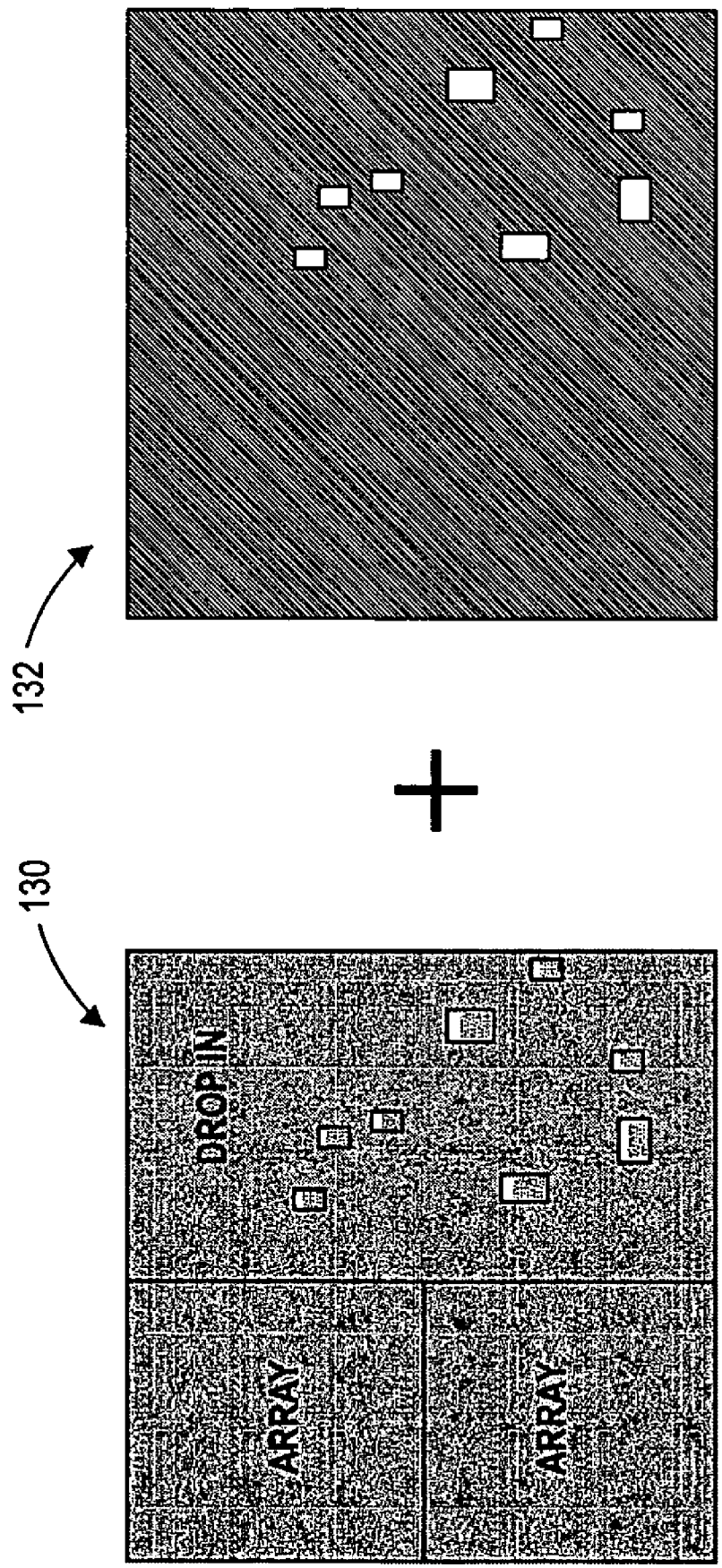
FIG. 7 illustrates one example overhead view of a work piece with areas intended for microelectronic arrays and a drop in area for testing purposes and a corresponding mask for photolithography.

FIG. 7 illustrates one example overhead view of a work piece 130 with areas intended for microelectronic arrays and a drop-in area for testing purposes and a corresponding mask 132 for photolithography. Referring to FIG. 7, the work piece 130 may be prone to photoresist peeling in particular areas after development. For example, the areas prone to peeling after development may be in the drop-in area of the work piece, as shown by the small rectangle areas. For these areas, a mask 132 can be used to expose those areas prone to photoresist peeling on the work piece 130. The mask 132 can be a binary mask, or any other suitable masks. Thus, a second exposure following an initial exposure using the mask 132, can allow the areas prone to peeling to be removed.

In the above examples of FIGS. 6 and 7, the masks 120 and 124 can be used for the first and second masks of FIGS. 2 and 3. Additionally, the masks described above can include light blocking material or light transparent material to define the pattern. The light transparent material allowing light to be radiated through the mask and exposed selective portions of the photosensitive material.

Thus, a method of exposure for lithography process and mask therefore have been described. In the foregoing specification, the invention has been described with reference to specific examples and embodiments. It will, however, be evident that various modifications and changes may be made thereto without departing from the broader spirit and scope of the invention as set forth in the appended claims. The specification and drawings are, accordingly, to be regarded in an illustrative rather than a restrictive sense.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A semiconductor photolithography method comprising:
providing a substrate coated with a photosensitive material;
performing a first exposure on the photosensitive material by using a first mask having a light passing pattern such that one or more portions of the photosensitive material is under-exposed or incompletely exposed, and one or more portions of the photosensitive material is completely exposed;
performing a second exposure by using a second mask with a second light passing pattern only on the one or more under-exposed or incompletely exposed portions of photosensitive material such that the one or more under-exposed or incompletely exposed portions from the first exposure are completely exposed, the second light passing pattern is a portion of the first light passing pattern and is corresponding to the under-exposed or incompletely exposed portions of photosensitive material.

2. The method of claim 1, wherein performing a second exposure includes:
radiating light through the second mask having the second light passing pattern corresponding to the under-exposed or incompletely exposed portions in order to further expose those portions.

3. The method of claim 2, wherein radiating light through the second mask includes radiating light through a binary mask.

4. The method of claim 2, further comprising:
projecting the second light passing pattern on the photosensitive material to expose the under-exposed or incompletely exposed portions.

5. The method of claim 1, further comprising:
developing the photosensitive material to remove unwanted material or scum.

6. A semiconductor photolithography method comprising:
exposing photosensitive material on a substrate with a first dose of light radiation using a first mask, the photosensitive material exposed with the first mask having one or more under-exposed or incompletely exposed portions. wherein the first mask has a first light passing pattern; and
exposing the photosensitive material on the substrate with a second dose of light radiation using a second mask such that the under-exposed or incompletely exposed portions are substantially fully exposed, and wherein the second mask has a second light passing pattern and the second light passing pattern is a portion of the first pattern and the second light passing pattern overlaps the first light passing pattern only at the locations of one or more under-exposed or incompletely exposed portions.

7. The method of claim 6, wherein exposing the photosensitive material with the second mask includes providing the second mask with the second light passing pattern corresponding with the under-exposed or incompletely exposed portions.

8. The method of claim 6, wherein exposing the photosensitive material with the first mask includes providing a half tone phase shift mask.

9. The method of claim 8, wherein exposing the photosensitive material with the second mask includes providing a binary mask.

10. The method of claim 6, wherein exposing the photosensitive material with the first mask includes coating a positive or negative photosensitive material on the substrate.

11. The method of claim 6, wherein exposing the photosensitive material with the first mask or the second mask includes radiating light in the ultraviolet (UV) wavelength range.

12. The method of claim 6, wherein the first dose of light radiation is different than the second dose of light radiation.

13. The method of claim 6, further comprising:
exposing the photosensitive material on the substrate with a third dose of light radiation using a third mask such that the under-exposed or incompletely exposed portions are fully exposed and wherein the third dose of light radiation is different from the first and second dose of light radiation.

14. A semiconductor photolithography method comprising:
exposing photosensitive material on a substrate with a first dose of light radiation using a first mask, the photosensitive material exposed with the first mask having one or more portions prone to peeling, wherein the first mask has a first light passing pattern; and
exposing the one or more photosensitive material exposed with the first mask with a second dose of light radiation using a second mask only on the one or more portions prone to peeling such that the portions prone to peeling are fully exposed: wherein the second mask has a second light passing pattern and the second light passing pattern is a portion of the first light passing pattern.

15. The method of claim 14, wherein exposing the photosensitive material with the second mask includes providing the second mask with the second light passing pattern corresponding with the portions prone to peeling.

16. The method of claim 14, wherein exposing the photosensitive material with the first mask includes providing a half tone phase shift mask or binary mask (BIM), and the second mask is binary mask.

17. The method of claim 14, wherein exposing the photosensitive material with the first mask includes coating a positive or negative photosensitive material on the substrate.

18. The method of claim 14, wherein exposing the photosensitive material with the first mask or the second mask includes radiating light in the ultraviolet (UV) wavelength range.

19. The method of claim 14, wherein the first dose of light radiation is different than the second dose of light radiation.

20. A method for fabricating semiconductor devices comprising:
exposing a substrate coated with a photosensitive material using a first mask having a first light passing pattern, the photosensitive material after said first exposure including one or more under-exposed or incompletely exposed portions or one or more portions prone to peeling; and
only exposing the under-exposed or incompletely exposed portions or portions prone to peeling using a second mask having a second light passing pattern such that those portions are completely exposed, wherein the second light passing pattern is a portion of the first light passing pattern.

21. The method of claim 20, wherein the first mask includes a half tone phase shift mask or a binary mask and the second mask is a binary mask.

22. The method of claim 20, wherein exposing the portions with the second mask includes providing the second mask with the second light passing pattern that corresponds to the under-exposed or incompletely exposed portions or portions prone to peeling.

* * * * *